United States Patent
Park et al.

(10) Patent No.: US 8,237,214 B2
(45) Date of Patent: Aug. 7, 2012

(54) NON-VOLATILE MEMORY DEVICE INCLUDING METAL-INSULATOR TRANSITION MATERIAL

(75) Inventors: Wan-jun Park, Seoul (KR); Jo-won Lee, Suwon-si (KR); Sang-hun Jeon, Yongin-si (KR); Chung-woo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 378 days.

(21) Appl. No.: 11/980,352

(22) Filed: Oct. 31, 2007

(65) Prior Publication Data

US 2008/0157186 A1 Jul. 3, 2008

(30) Foreign Application Priority Data

Dec. 29, 2006 (KR) .................. 10-2006-0138863

(51) Int. Cl.
*H01L 29/792* (2006.01)
(52) U.S. Cl. ........ 257/324; 257/314; 257/315; 257/316; 257/317
(58) Field of Classification Search .............. 257/298, 257/310, 315, 324, E21.209, E21.21, E29.165, 257/E29.129, E29.308, E29.309
See application file for complete search history.

(56) References Cited

U.S. PATENT DOCUMENTS

| | | | |
|---|---|---|---|
| 6,818,516 B1 * | 11/2004 | Lo et al. ................ | 438/287 |
| 6,853,027 B2 | 2/2005 | Takasu | |
| 6,903,361 B2 | 6/2005 | Gilton | |
| 7,098,496 B2 * | 8/2006 | Li et al. ................ | 257/295 |
| 7,166,886 B2 * | 1/2007 | Forbes ................. | 257/315 |
| 7,612,403 B2 * | 11/2009 | Bhattacharyya .......... | 257/317 |
| 2005/0212059 A1 * | 9/2005 | Choi et al. ............. | 257/390 |
| 2005/0282327 A1 * | 12/2005 | Forbes ................ | 438/201 |
| 2006/0151826 A1 * | 7/2006 | Jin et al. .............. | 257/316 |
| 2006/0255392 A1 * | 11/2006 | Cho et al. ............. | 257/310 |
| 2008/0073689 A1 * | 3/2008 | Wang et al. ........... | 257/314 |
| 2008/0217677 A1 * | 9/2008 | Jeon et al. ............ | 257/321 |
| 2009/0191676 A1 * | 7/2009 | Forbes ................ | 438/261 |
| 2010/0109074 A1 * | 5/2010 | Seol et al. ............ | 257/325 |

FOREIGN PATENT DOCUMENTS

| | | |
|---|---|---|
| JP | 2000-269367 A | 9/2000 |
| JP | 2003-023140 A | 1/2003 |
| KR | 1020030002298 A | 1/2003 |
| KR | 1020040022083 A | 3/2004 |
| KR | 1020060052126 A | 5/2006 |

OTHER PUBLICATIONS

Korean Office Action dated Mar. 27, 2012, issued in corresponding Korean Application No. 10-2006-0138863, with English translation.

* cited by examiner

*Primary Examiner* — Jerome Jackson, Jr.
*Assistant Examiner* — David Spalla
(74) *Attorney, Agent, or Firm* — Harness, Dickey & Pierce, P.L.C.

(57) ABSTRACT

A non-volatile memory device including a metal-insulator transition (MIT) material is provided. The non-volatile memory device includes a gate stack having a tunneling layer, a charge trap layer, a blocking layer and a gate electrode formed on a substrate, wherein at least one of the tunneling layer and the blocking layer is formed of an MIT (metal-insulator transition) material.

8 Claims, 3 Drawing Sheets

NON-VOLATILE MEMORY DEVICE INCLUDING METAL-INSULATOR TRANSITION MATERIAL

PRIORITY STATEMENT

This application claims the benefit of priority under 35 U.S.C. §119 from Korean Patent Application No. 10-2006-0138863, filed on Dec. 29, 2006, in the Korean Intellectual Property Office, the disclosure of which is incorporated herein in its entirety by reference.

BACKGROUND

1. Field

Example embodiments relate to a semiconductor memory device. Other example embodiments relate to a non-volatile memory device including a metal-insulator transition (MIT) material.

2. Description of the Related Art

Of the semiconductor memory devices, non-volatile memory devices maintain stored data even when power is turned off.

The configuration of a memory cell, which is a basic element in a non-volatile memory device, differs depending on the field where the non-volatile memory device is used. A flash memory device is a type of non-volatile memory device.

FIG. 1 is a diagram illustrating a cross-sectional view of a conventional flash memory device.

Referring to FIG. 1, a source region 11 and a drain region 12 may be formed in a substrate 10. A gate stack 20 may be formed on the substrate 10 between the source region 11 and the drain region 12. The gate stack 20 may include a tunneling layer 30, a charge trap layer 40, a blocking layer 50 and a gate electrode 60.

In the conventional flash memory device, leakage of charges is prevented (or reduced) by blocking the charges using the tunneling layer 30 and the blocking layer 50. The tunneling layer 30 may be formed having a thickness of 5 nm to 10 nm. If the thickness of the tunneling layer 30 decreases, a charge storing speed increases. As such, the charge leakage may increase. As the charge storing speed increases, the retention characteristics of the memory device may decrease. If the thickness of the tunneling layer 30 increases, the retention characteristics may increase. A threshold voltage for a writing operation may also increase resulting in a reduced writing speed.

SUMMARY

Example embodiments relate to a semiconductor memory device. Other example embodiments relate to a non-volatile memory device including a metal-insulator transition (MIT) material.

Example embodiments provide a non-volatile memory device that has increased writing speed and retention characteristics due to the use of a metal-insulator transition material as a charge migration path.

According to example embodiments, there is provided a non-volatile memory device including a gate stack having a tunneling layer, a charge trap layer, a blocking layer and a gate electrode formed on a substrate. At least one of the tunneling layer and the blocking layer may be formed of an MIT (metal-insulator transition) material. The non-volatile memory device may include a tunneling oxide layer between the tunneling layer and the substrate.

The MIT material may include an oxide. The oxide may be a transition metal oxide. The MIT material may be one selected from the group consisting of $KTaO_3$, $WO_3$ doped with Na, TiAlO, NiO, $V_2O_3$, $VO_2$, $TiO_2$, $BaTiO_3$, $ZrO_2$, $Nb_2O_5$, $SrTiO_3$, TiAlO, and ZrAlO and combinations thereof. The MIT material may be formed having a thickness of 5 nm to 100 nm.

The charge trap layer may be formed of a material including Si and/or Ge. The charge trap layer may be formed of a material selected from the group consisting of Si rich SiN, SiN, SiO (silicon oxide), Si rich SiO, Si rich SiON, $SiO_2$ with Si nano crystals, SiN with Si nano crystals, Ge rich GeO, $SiO_2$ with Ge nano crystals, SiN with Ge nano crystals, Ge rich GeON, SiO with Ge nano crystals and combinations thereof.

The blocking layer may be formed of a material including Si and/or Ge. The blocking layer may be one selected from the group consisting of $SiO_2$, $HfO_2$, $ZrO_2$, $Si_3N_4$, $Al_2O_3$, HfSiON, HfON, HfAlO and combinations thereof.

The tunneling oxide layer may be formed to a thickness of 5 Å to 20 Å. The tunneling oxide layer may be formed of a material selected from the group consisting of SiO2, HfO2, ZrO2, $Si_3N_4$, $Al_2O_3$, HfSiON, HfON, HfAlO, and combinations thereof.

BRIEF DESCRIPTION OF THE DRAWINGS

Example embodiments will be more clearly understood from the following detailed description taken in conjunction with the accompanying drawings.

FIG. 1 is a diagram illustrating a cross-sectional view of a conventional flash memory;

FIG. 2 is a diagram illustrating a cross-sectional view of a non-volatile memory device including a metal-insulator transition (MIT) material according to example embodiments;

FIGS. 3 and 4 are graphs showing current-voltage (I-V) characteristics of the MIT material of the non-volatile memory device of FIG. 2; and FIG. 5 is a diagram illustrating a cross-sectional view illustrating a non-volatile memory device that includes an MIT material according to example embodiments.

DETAILED DESCRIPTION

Figure 1:
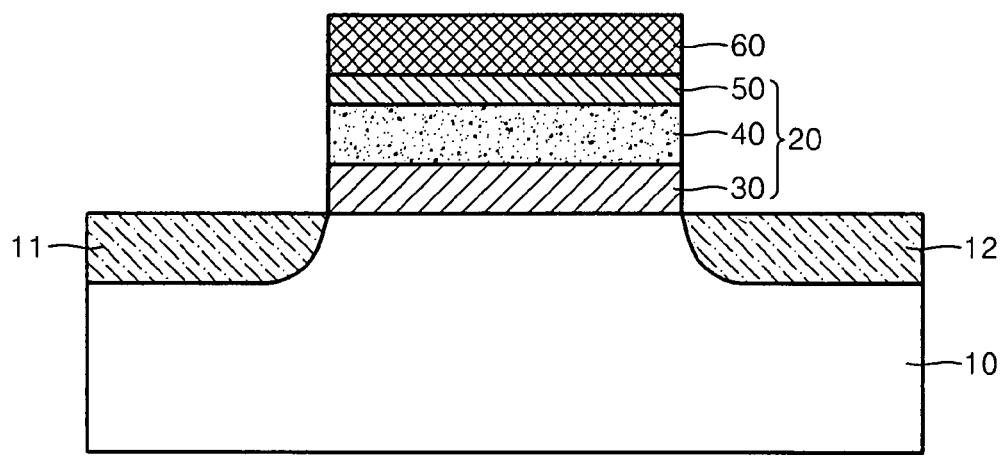
FIGS. 1-5 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Example embodiments relate to a semiconductor memory device. Other example embodiments relate to a non-volatile memory device including a metal-insulator transition (MIT) material.

Figure 2:
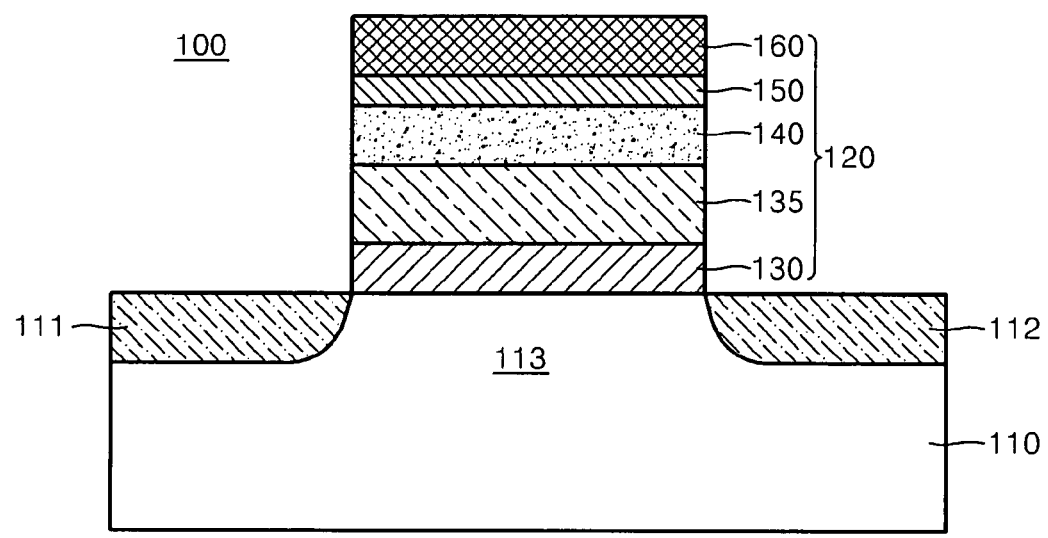

FIG. 2 is a diagram illustrating a cross-sectional view of a non-volatile memory device 100 that includes a metal-insulator transition (MIT) material according to example embodiments.

Referring to FIG. 2, the non-volatile memory device 100 may include a gate stack 120 on a substrate 110.

A source region 111 and a drain region 112 doped with a desired impurity may be separately formed in the substrate 110. The gate stack 120 that contacts the source region 111 and the drain region 112 may be formed between the source region 111 and the drain region 112. A channel region 113 may be formed between the source region 111 and the drain region 112 under the gate stack 120. The gate stack 120 may include a tunneling oxide layer 130, a metal-insulator transition (MIT) material layer 135, a charge trap layer 140, a blocking layer 150 and a gate electrode 160.

According to example embodiments, the MIT material layer 135 functions as a conductor if a desired threshold voltage is applied to the gate electrode 160 in order to write or erase data. The MIT material layer 135 functions as a pathway of charges between the charge trap layer 140 and the channel region 113. As such, the non-volatile memory device 100 according to example embodiments has a threshold voltage lower than a conventional flash memory device.

If a voltage lower than the threshold voltage is applied to the gate electrode 160, the MIT material layer 135 functions as an insulator. The migration of charges stored in the charge trap layer 140 may be blocked.

The tunneling oxide layer 130 may increase the retention characteristics of the MIT material layer 135. The tunneling oxide layer 130 may be formed having a thickness of 10 Å to 20 Å.

The tunneling oxide layer 130 may be formed with a substantially small thickness in order to promote an increase in the writing speed and retention characteristics of the memory device. The non-volatile memory device according to example embodiments may be formed without the tunneling oxide layer 130.

The tunneling oxide layer 130 may be formed of a material selected from the group consisting of $SiO_2$, $HfO_2$, $ZrO_2$, $Si_3N_4$, $Al_2O_3$, HfSiON, HfON, HfAlO and combinations thereof.

The MIT material layer 135 may be formed of a transition metal oxide, a transition alkali-metal oxide, a lanthanide oxide and combinations thereof. The MIT material layer 135 may be formed of a material selected from the group consisting of $KTaO_3$, $WO_3$ doped with Na, TiAlO, NiO, $V_2O_3$, $VO_2$, $TiO_2$, $BaTiO_3$, $ZrO_2$, $Nb_2O_5$, $SrTiO_3$, TiAlO, ZrAlO and combinations thereof. The MIT material layer 135 may be formed having a thickness of 5 nm to 100 nm.

The charge trap layer 140 may be formed of a material selected from the group consisting of Si rich SiN, SiN, SiO (silicon oxide), Si rich SiO, Si rich SiON, $SiO_2$ with Si nano crystals, SiN with Si nano crystals, Ge rich GeO, $SiO_2$ with Ge nano crystals, SiN with Ge nano crystals, Ge rich GeON, SiO with Ge nano crystals and combinations thereof. In the $SiO_2$ with Si nano crystals, Si nano crystals may be formed in a $SiO_2$ layer and the Si nano crystals may store charges.

The blocking layer 150 blocks the migration of charges from the charge trap layer 140 to the gate electrode 160. The blocking layer 150 may be formed of a material selected from the group consisting of $SiO_2$, $HfO_2$, $ZrO_2$, $Si_3N_4$, $Al_2O_3$, HfSiON, HfON, HfAlO and combinations thereof.

The gate electrode 160 may be formed of a metal film having a substantially large work function (e.g., Au or Al). The gate electrode 160 may also be formed of a silicide material (e.g., Ru, TaN, NiSi or the like) used to form a gate electrode of a semiconductor memory device.

Because the MIT material layer 135 is formed below the charge trap layer 140 and the tunneling oxide layer 130 is formed relatively thin, the MIT material layer 135 may function as a conductor if a threshold voltage is applied to the gate electrode 160. If electrons pass through the tunneling oxide layer 130 from the channel region 113 of the substrate 110, the electrons may readily migrate to the charge trap layer 140. The thin tunneling oxide layer 130 may decrease (or reduce) a writing voltage of the non-volatile memory device 100 according to example embodiments. As such, the writing speed increases.

If a voltage less than the threshold voltage is applied to the gate electrode 160, the MIT material layer 135 may function as an insulator. The charge leakage of the charge trap layer 140 may be blocked. If the MIT material layer 135 functions as a conductor, the MIT material layer 135 will not affect the writing speed although the MIT material layer 135 is thick. As such, the retention characteristics may increase.

Figure 3:
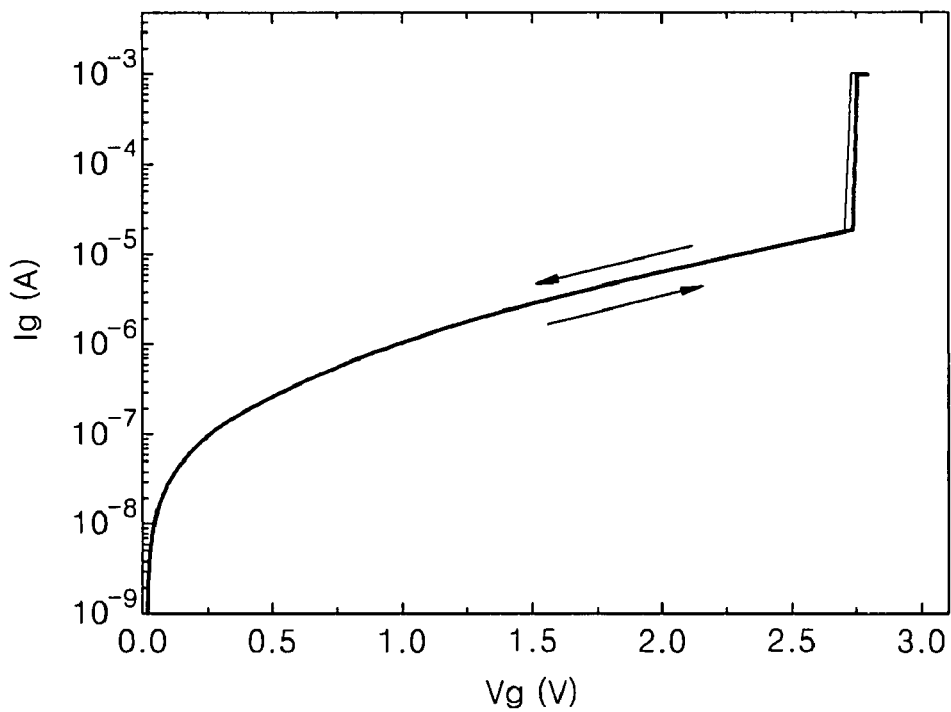
Figure 4:
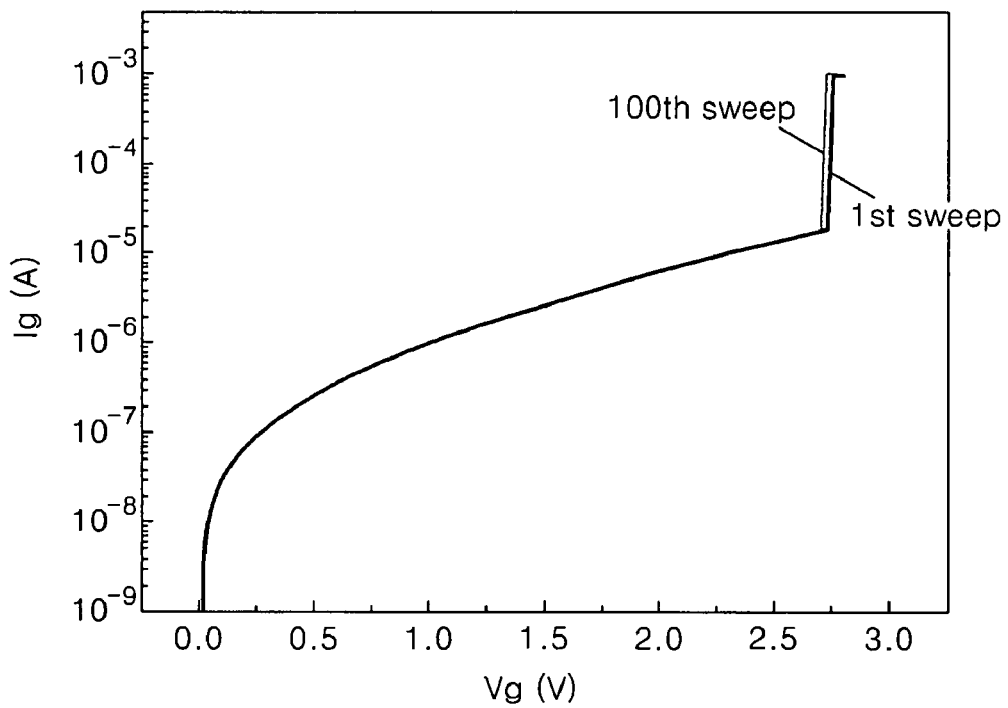

FIGS. 3 and 4 are graphs showing current-voltage (I-V) characteristics of a MIT material used according to example embodiments. The. MIT material is formed with NiO and having a thickness of 50 nm. The current that flows through the MIT material was measured by applying a voltage to electrodes formed on both sides of the MIT material.

Referring to FIG. 3, a high current (showing no hysteresis) was measured at a voltage greater than the threshold voltage is applied to the gate electrode 160. The NiO functioned as a conductor. A low current was measured at a voltage lower than the threshold voltage. The NiO functioned as an insulator. The threshold voltage was approximately 2.7V. Considering that the threshold voltage of a conventional flash memory device is about 18V, the non-volatile memory device according to example embodiments has a substantially lower threshold voltage.

Referring to FIG. 4, a first sweep and a $100^{th}$ sweep show (or exhibit) similar I-V characteristics. The MIT material has constant current-voltage (I-V) characteristics. A stable I-V characteristic may be obtained if the MIT material is used in a non-volatile memory device.

Figure 5:
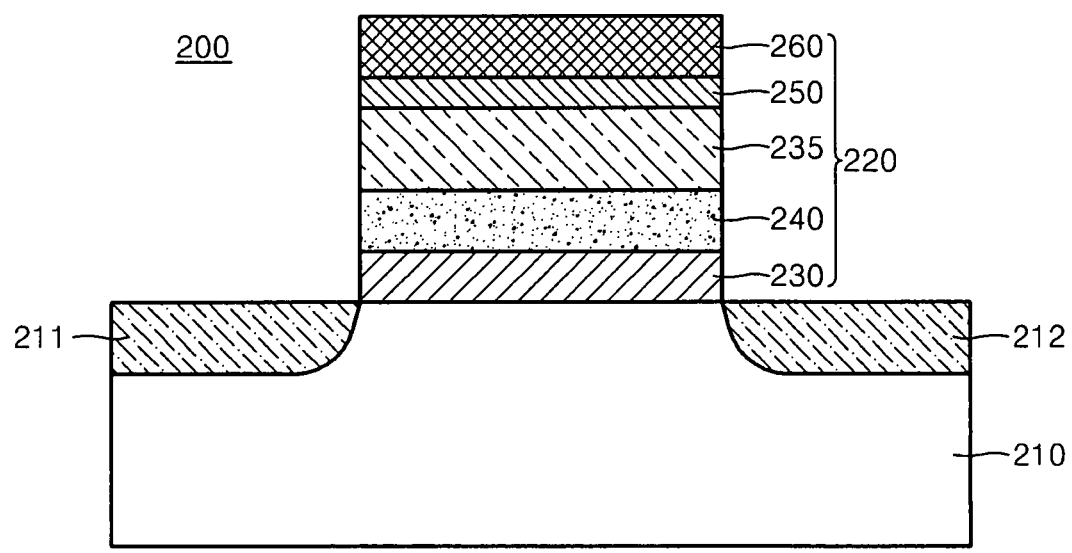

FIG. 5 is a diagram illustrating a cross-sectional view of a non-volatile memory device 200 including a MIT material according to example embodiments.

Referring to FIG. 5, the non-volatile memory device 200 includes a gate stack 220 on a substrate 210.

A source region 211 and the drain region 212 doped with a desired impurity may be separately formed in the substrate 210. The gate stack 220 that contacts the source region 211 and the drain region 212 may be formed on the substrate 210 between the source region 211 and the drain region 212. The gate stack 220 may include a first layer 230, a charge trap layer 240, a MIT material layer 235, a second layer 250 and a gate electrode 260.

In the non-volatile memory device 200, electrons migrate from the gate electrode 260 to the charge trap layer 240 through the second layer 250 in response to a negative voltage applied to the gate electrode 260. The first layer 230 functions as a blocking layer.

According to example embodiments, the MIT material layer 235 functions as a conductor if a desired threshold voltage is applied to the gate electrode 260 in order to write or erase data. The MIT material layer 235 functions as a pathway of charges between the charge trap layer 240 and a channel region. The non-volatile memory device 200 according to example embodiments has a threshold voltage lower than a conventional flash memory device.

If a voltage lower than the threshold voltage is applied to the gate electrode 260, the MIT material layer 235 functions as an insulator. The migration of charges stored in the charge trap layer 240 may be blocked.

The first layer 230 corresponds to the blocking layer 150 of FIG. 2. The second layer 250 corresponds to the tunneling oxide layer 130 of FIG. 2. Therefore, a description of like elements will be omitted for the sake of brevity.

As described above, in the non-volatile memory device 200 according to example embodiments, the MIT material layer 235 functions as a conductor if a threshold voltage is applied to the gate electrode 260 because the MIT material layer 235 is formed on the charge trap layer 240 and the second layer is formed relatively thin. If electrons pass through the second layer 250 from the gate electrode 260, the electrons readily migrate to the charge trap layer 240. The thin second layer 250 reduces a writing voltage of the non-volatile memory device 200 according to example embodiments. As such, the writing speed increases.

If a voltage not greater than the threshold voltage is applied to the gate electrode 260, the MIT material layer 235 functions as an insulator. As such, the charge leakage of the charge trap layer 240 is blocked. If the MIT material layer 235 functions as a conductor, the MIT material layer 235 may not affect the writing speed although the MIT material layer 135 is formed substantially thick. As such, the retention characteristics may increase.

In example embodiments, the MIT material layer may be formed on or under the charge trap layer. However, example embodiments are not limited thereto. The MIT material layer may be formed both on and under the charge trap layer. In this case, the tunneling oxide layer and the second layer may be formed on and under the two MIT material layers.

As described above, in a non-volatile memory device according to example embodiments, a threshold voltage may be decreased by forming a MIT material layer on or under a charge trap layer. If the MIT material layer functions as a conductor, migration speed of electrons increases. As such, the writing speed increases. The retention characteristics may increase by increasing the thickness of the MIT material layer.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A non-volatile memory device, comprising:
   a gate stack including a tunneling oxide layer, a tunneling layer, a charge trap layer, a blocking layer and a gate electrode sequentially formed on a substrate,
   wherein the tunneling layer includes a metal-insulator transition (MIT) material,
   the MIT material includes at least one selected from the group consisting of $KTaO_3$, $WO_3$ doped with Na, TiAlO, NiO, $V_2O_3$, $VO_2$, $BaTiO_3$, $Nb_2O_5$, ZrAlO and combinations thereof,
   the tunneling oxide layer has a thickness of 5 Å to 20 Å, and the MIT material has a thickness of 5 nm to 100 nm.

2. The non-volatile memory device of claim 1, wherein the charge trap layer includes a material having silicon (Si).

3. The non-volatile memory device of claim 2, wherein the material having silicon includes at least one selected from the group consisting of Si rich SiN, SiN, SiO (silicon oxide), Si rich SiO, Si rich SiON, $SiO_2$ with Si nano crystals, SiN with Si nano crystals, $SiO_2$ with Ge nano crystals, SiO with Ge nano crystals and combinations thereof.

4. The non-volatile memory device of claim 1, wherein the charge trap layer includes a material having germanium (Ge).

5. The non-volatile memory device of claim 4, wherein the material having germanium includes at least one selected from the group consisting of Ge rich GeO, $SiO_2$ with Ge nano crystals, Ge rich GeON, SiO with Ge nano crystals and combinations thereof.

6. The non-volatile memory device of claim 1, wherein the blocking layer includes a material having a transition metal oxide.

7. The non-volatile memory device of claim 6, wherein the transition metal oxide is at least one selected from the group consisting of $HfO_2$, $ZrO_2$, $Al_2O_3$, HfSiON, HfON, HfAlO and combinations thereof.

8. The non-volatile memory device of claim 1, wherein the MIT material includes at least one selected from the group consisting of $WO_3$ doped with Na, NiO, $V_2O_3$, $VO_2$, $BaTiO_3$, $Nb_2O_5$ and combinations thereof.

* * * * *